(12) United States Patent
Takami

(10) Patent No.: US 7,037,597 B2
(45) Date of Patent: May 2, 2006

(54) COPPER FOIL FOR PRINTED-WIRING BOARD

(75) Inventor: Masato Takami, Uji (JP)

(73) Assignee: Fukuda Metal Foil & Powder Co., Ltd., Kyoto (JP)

( * ) Notice: Subject to any disclaimer, the term of this patent is extended or adjusted under 35 U.S.C. 154(b) by 0 days.

(21) Appl. No.: 10/841,080

(22) Filed: May 7, 2004

(65) Prior Publication Data

US 2004/0229070 A1 Nov. 18, 2004

(30) Foreign Application Priority Data

May 13, 2003 (JP) ............................. 2003-133853

(51) Int. Cl.
*H05K 3/00* (2006.01)
*B32B 15/20* (2006.01)
*B32B 15/18* (2006.01)

(52) U.S. Cl. ...................... 428/647; 428/620; 428/674; 428/676

(58) Field of Classification Search ................ 428/647, 428/620, 674, 676
See application file for complete search history.

(56) References Cited

U.S. PATENT DOCUMENTS

| | | | |
|---|---|---|---|
| 6,544,664 B1 * | 4/2003 | Takahashi et al. | 428/607 |
| 6,638,642 B1 * | 10/2003 | Kitano et al. | 428/607 |
| 6,660,406 B1 * | 12/2003 | Yamamoto et al. | 428/615 |
| 6,709,966 B1 * | 3/2004 | Hisatsune et al. | 438/613 |
| 6,833,198 B1 * | 12/2004 | Sakamoto et al. | 428/596 |
| 2002/0182432 A1 * | 12/2002 | Sakamoto et al. | |
| 2003/0036840 A1 * | 2/2003 | Kajita et al. | |
| 2003/0180619 A1 * | 9/2003 | Tamura et al. | |

FOREIGN PATENT DOCUMENTS

| | | | |
|---|---|---|---|
| JP | 2000-252609 | * | 9/2000 |
| JP | 2001-44597 | | 2/2001 |
| JP | 3258308 | | 8/2001 |
| JP | 2001-308544 | | 11/2001 |
| JP | 2003-036840 | * | 2/2003 |
| JP | 2003-257418 | * | 9/2003 |
| JP | 2004-314568 | * | 11/2004 |
| JP | 2004-807134 | * | 11/2004 |

OTHER PUBLICATIONS

JP 2004-314568 English Abstract (JPAB), Takami, Copper Foil for Printed Wiring Board, Nov. 2004.*
JP 2003-257418 English Abstract (DWPI), Nikko Kinzoku KK, Negative Electrode for Secondary Batteries, Sep. 2003.*

* cited by examiner

*Primary Examiner*—Deborah Jones
*Assistant Examiner*—Jason L. Savage
(74) *Attorney, Agent, or Firm*—Hodgson Russ LLP

(57) ABSTRACT

It is an object of the present invention to provide a surface-treated copper foil wherein a surface layer which is situated on a side being not bonded to a resin in a copper foil for a printed-wiring board and on which a copper direct drilling process by carbon dioxide laser is easily applied is prepared with a small amount of a covering material in accordance with a simple manner.

In the copper foil used for a direct drilling process by laser of the present invention, 50 to 1000 mg/m$^2$ of a covering layer consisting of iron and tin, or a covering layer made of an alloy prepared from iron, tin, and at least one member selected from the group consisting of nickel, cobalt, zinc, chromium, and phosphorous is provided on at least one side of the copper foil.

3 Claims, No Drawings

# COPPER FOIL FOR PRINTED-WIRING BOARD

BACKGROUND OF THE INVENTION

1. Field of the Invention

The present invention relates to a surface treatment for a copper foil, and more particularly to a copper foil used for a printed-wiring board wherein the copper foil has a performance based on which a laser drilling process can be directly applied.

2. Description of the Related Art

A copper foil is widely used for printed-wiring board applications. In this respect, although studies for a semi-additive or additive circuit-formation process in accordance with copper plating are technically developed, a mainstream is still now in a subtractive process wherein a copper foil is used, and unnecessary parts are removed by etching to form a circuit. Accordingly, a copper foil is an indispensable conductive material. There are such a case where matte side replica of copper foil is utilized in a semi-additive or additive process, and a case where an ultrathin copper foil is used, a circuit is formed thereon, and the ultrathin copper foil is subjected to quick etching. Thus, applications of copper foil are extensive.

Printed-wiring boards are manufactured in accordance with a variety of buildup processes, and there are recently increasing flexible printed-wiring boards. Under the circumstances, tendencies of high density, high reliability, further small sizing and weight saving become prominent in a field of printed-wiring boards. In this connection, severe qualities are required also for copper foil being a material for constituting a printed-wiring board.

In an usual manufacture of a printed-wiring board, first, a matte side of a copper foil is superimposed on a synthesized resin-impregnated material to laminate them, and they are thermally contact-bonded by means of a press to obtain a copper clad laminate. Such a copper clad laminate is produced from a glass epoxy material which is usually applied by pressing the material at a temperature of 170 to 190° C. for one to two hours.

As a copper foil for a printed-wiring board, an electrolytic copper foil having a coarse surface on a side (matte side) and a glossy surface on the other side (shiny side) is principally applied. Such electrolytic copper foil is prepared usually according to the following manner. Copper is electrolytically deposited from a copper electrolytic solution by means of an electrodepositing apparatus to manufacture a raw copper foil called by the name of an untreated copper foil, and then, a surface of the raw copper foil is treated by means of a treating machine. In general, the matte side of the raw foil is pickled and roughened so that the surface in which an adhesive force with a resin is ensured is produced. Furthermore, a variety of treatments for improving and stabilizing heat-resisting, chemical-resisting, and the like resisting properties or etching performance or the like is carried out to maintain these properties in the adhesiveness. A variety of treatments for providing heat-resistant, anti-corrosive and the like properties is also applied to a shiny side of the copper foil to obtain a final product. As to these treatments, a variety of technologies is developed and proposed, so that such copper foil exhibits a surface of a high performance.

On one hand, requests for realizing a fine pattern, and high density increase more and more with respect to printed-wiring board, so that it is difficult to drill a fine and highly accurate hole such as through-hole, via-hole and the like holes by the use of a small-diameter drill. Accordingly, processing by means of laser such as carbon dioxide laser, excimer laser, and YAG laser is introduced.

Since carbon dioxide laser suitable for mass production involves such a problem that drilling is difficult on a shiny side of a copper foil, improvements in properties of such shiny side are demanded.

In general, a so-called conformal mask drilling method is applied wherein a copper foil corresponding to an expected position of a hole is removed previously by etching, and a laser is irradiated on the position to form the hole. However, the conformal mask drilling method has many manufacturing processes, so that it is complicated and disadvantageous in view of mass production.

Since it is difficult to drill directly on a copper foil surface with low energy in carbon dioxide laser as mentioned above, a variety of manners such as black oxide processing for a copper foil surface, a manner for making a surface coarse by chemical processing, and a method wherein a surface is covered with a metal such as Ni, and Co to elevate laser absorptivity, and the resulting product is worked directly is tried to apply in case of drilling a hole.

More specifically, a method for covering a copper foil with an alloy of In, Sn, Co, Zn, and Ni at 0.1 to 100 $mg/dm^2$ (10 to 10000 $mg/m^2$) wherein Zn is at 0.5 to 100 $mg/dm^2$ (50 to 10000 $mg/m^2$) is disclosed in, for example, Japanese Patent No. 3258308. It is also proposed, for example, in Japanese Laid-open Patent Publication No. 2001-44597 to apply metal oxide processing or chemical processing on a copper foil surface, or to provide a layer containing a metal compound powder, a carbon powder and the like on a copper foil surface.

Furthermore, it is proposed to provide a nickel layer having 0.08 to 2 μm thickness, a cobalt layer of 0.05 to 3 μm, or a zinc layer of 0.03 to 2 μm thickness on a copper foil surface wherein 0.03 μm corresponds to 210 $mg/m^2$, and 2 μm corresponds to 14200 $mg/m^2$, when a specific gravity of zinc is supposed to be 7.1 in, for example, Japanese Laid-open Patent Publication No. 2001-308544.

Although an amount of around 200 $mg/^2$ close to the lower limit is not so significant problem, an amount of 1000 to 10000 $mg/m^2$ is extremely large amount, so that a layer to be coated becomes thick, and a long period of time is required for the formation, resulting in an undesirable situation in view of productivity. Besides, when such layer is intended to remove, a considerable time is required for the removal. Thus, there is such a disadvantage that a study of a manner for effluent disposal becomes necessary, and such removal of the layer is not desired in view of environmental load.

Moreover, a so-called black oxide processing for obtaining a copper oxide film which is usually used for a surface treatment of an inner layer copper in a multi-layer board is carried out by immersing the board into an alkali solution containing an oxidizing agent at a high temperature of around 90° C. However, this method is complicated, and disadvantageous from economical and time-wasting points of view due to processing of chemicals to be used. Furthermore, a treatment for roughening (etching) a shiny side of a copper foil by the use of chemicals involves the same problems as that mentioned above.

SUMMARY OF THE INVENTION

Accordingly, it is an object of the present invention to solve the above-described problems, and to provide a surface-treated copper foil wherein a surface layer which is situated on a side being not bonded to a resin in a copper foil for a printed-wiring board and on which a copper direct drilling process by carbon dioxide laser (direct laser processing) is easily applied is prepared with a small amount of a covering material in accordance with a simple manner.

In order to achieve the above-described object, a copper foil used for a direct drilling process by laser of the present invention comprises a copper foil, and 50 to 1000 mg/m$^2$ of a covering layer consisting of iron and tin where in the covering layer is provided on at least one side of the copper foil. Furthermore, a copper foil used for a direct drilling process by laser of the present invention comprises a copper foil, and 50 to 1000 mg/m$^2$ of a covering layer made of an alloy prepared from iron, tin, and at least one member selected from the group consisting of nickel, cobalt, zinc, chromium, and phosphorous wherein the covering layer is provided on at least one side of the copper foil.

DESCRIPTION OF THE PREFERRED EMBODIMENTS

A wavelength of carbon dioxide laser which is usually used in a printed-wiring board is generally within an infrared region of 9.3 to 10.6 μm. On one hand, a wavelength of excimer laser or UV-YAG laser is within an ultraviolet region of 0.2 to 0.4 μm The reason why a copper foil is difficult to process by means of carbon dioxide laser is considered to be fundamentally due to properties of spectral reflection factor of metal. In this respect, a reflection factor based on a shape of an article differs from a reflection factor peculiar to metal wherein the reflection factor of metal is derived from collective motion of free electrons, so that there are different components from that involved in the shape of an article.

Namely, a spectral reflection factor of copper is high in infrared region, while it decreases in ultraviolet region. This phenomenon means that a laser is easily reflected by copper in a wavelength of carbon dioxide laser, while copper is easily penetrated in a short wavelength of excimer laser, and in fact, the experimental results exhibit such tendency described above. Accordingly, penetration of a copper foil is achieved by either applying a laser beam of a short wavelength, or applying a material which makes spectral reflection factor to be lower to a copper foil surface.

Since reflection factor is derived from free electrons, a metal having a high reflection factor exhibits generally a good conductivity. To improve laser processability, it is preferable to apply a metal having a low conductivity on a copper foil surface as a film. Fe and Sn are suitable for this purpose with taking such factors that deleterious and expensive materials are excluded, and that an electroplating method by which mass production is economically possible into consideration.

On the other hand, Au, Ag, Cu, and Al have extremely high conductivities, and their spectral reflection factors are also high, so that they are unsuitable for carbon diode laser processing. Furthermore, a single Ni, Co, Zn or the like is an electrically good conductor, so that it may be considered that they are not so effective, although they are better than the former materials Au, Ag, Cu, and Al. In addition, such fact that it is recognized to be black in a visible region which is usually considered to be advantageous for carbon dioxide laser processing is not identical to such fact that reflection is weak in infrared region. Hence, it cannot be judged that appropriateness of laser processing depends on color tone.

Of course, laser processability is not necessarily discussed on the basis of only a spectral reflection factor peculiar to metal as described above, but it must be understood by putting together a surface condition, an oxidized condition, a melting point and a boiling point of a surface layer, and the like factors. Nevertheless, it is considered that a spectral reflection factor peculiar to metal is essential.

The present inventor has studied a variety of the above-mentioned problems in the prior art, and as a result, a surface-treated copper foil having a surface layer to which is easily applied a copper direct drilling process by carbon dioxide laser on a side being not bonded to a resin that is prepared from a small amount of a covering by a simple manner is developed.

A covering layer according to the present invention is an alloy layer consisting of iron and tin, or another alloy layer consisting of iron, tin, and at least a member selected from the group consisting of nickel, cobalt, zinc, chromium, and phosphorous. A thickness of the covering layer is preferably within a range of from 50 mg/m$^2$ to 1000 mg/m$^2$. When a thickness of the covering layer is less than 50 mg/cm$^2$ or less, laser processability is poor, while when the thickness is 1000 mg/m$^2$ or higher, it is not economical. Furthermore, it is desirable to contain an amount of 10 mg/m$^2$ or more each of iron and tin in a covering layer. When each amount of iron and tin is 10 mg/m$^2$ or less, processability of the resulting copper foil becomes poor.

Although comparatively good laser processability is achieved by the use of only iron or tin, an alloy of iron and tin brings about much better processability.

On one hand, phosphorous has an effect for decreasing remarkably a conductivity of a covering layer, so that laser processability of the resulting copper foil is improved in reality.

Although electroplating method is supposed to apply for a formation of the-above-described covering layer, sputtering process, vapor deposition process and the like processes are also applicable, and thus, the present invention is not limited thereto. However, an application of electroplating method is the most practical, and advantageous from an economical point of view. A plating bath to be used is not limited, but a sulfuric acid bath, a citric acid bath, a pyrophosphoric acid bath and the like are preferred. A plating bath contains iron ion and tin ion, or iron ion, tin ion, and at least one members elected from the group consisting of nickel, cobalt, zinc, chromium, and phosphorous ions. A bath temperature is preferably within a range of from 15 to 50° C., and a current density is preferably within a range of from 0.5 to 10 A/dm$^2$ in a cathode electroplating.

In the meantime, a roughening process of a side wherein a resin is to be bonded on a copper foil according to the present invention may be carried out in accordance with a well-known roughening method. More specifically, for example, dendrites or granulated copper protrusions are deposited on a copper foil, and then, a copper plating is applied thereto for maintaining the copper protrusions to form a covering copper, whereby a coarse surface of the copper foil is obtained.

Specifically, a formation of copper protrusions is conducted as described hereunder.

Cathode electroplating (matte side of copper foil) for ten seconds is implemented under the following conditions:

50 g/liter of $CuSO_4.5H_2O$, 100 g/liter of $H_2SO_4$, room temperature, and 10 A/dm$^2$ current density.

Then, a copper plating for covering the copper protrusions is implemented in accordance with cathode electroplating for eighty seconds under the following conditions:

250 g/liter of $CuSO_4.5H_2O$, 100 g/liter of $H_2SO_4$, 50° C. temperature, and 5 A/dm2 current density.

Thus, roughening of a copper foil surface is completed. Thereafter, well-known processing for adding heat-resisting properties and chemical-resisting properties to the copper foil surface is carried out wherein a barrier layer disclosed in Japanese Patent Publication No. 2-24037 and the like is produced, and chromate processing and/or an organic corrosion protection process are conducted to obtain a matte side of the copper foil.

On the other hand, a layer, on which a copper direct drilling process by carbon dioxide is to be applied, according to the present invention is formed on an untreated copper foil in a shiny side of the copper foil as mentioned above. A covering layer having a thickness of around 50 to 1000 mg/m$^2$ is formed on the copper foil, and then, chromate processing may be applied as a processing for corrosion protection. In general, an aqueous solution containing dichromic acid ion is used wherein a dipping or cathode electroplating process is conducted in either an acidic or alkaline condition. An example of chemicals to be used in the process includes chromium trioxide, potassium bichromate, sodium bichromate and the like.

In order to improve a corrosion-protecting force, both the surfaces of a copper foil may be subjected to an organic corrosion protection processing wherein an organic chemical to be applied is typically benzotriazole; or a silane coupling agent processing and the like processing. A combination of both the processing specified above may also be applicable. An example of benzotriazoles used in organic corrosion protection includes methylbenzotriazole (tolyltriazole), aminobenzotriazole, carboxybenzotriazole, benzotriazole and the like. Any of these chemicals is applied in the form of an aqueous solution in accordance with a dipping, spraying or the like process. As organic chemicals other than those enumerated above, aliphatic carboxylic acids, alkyl amines, benzoic acids, imidazoles, triazinethiols are also applicable.

Although there are various silane coupling agents having epoxy groups, amino groups, mercapto groups, or vinyl groups, it is desirable to use an agent being compatible to a resin which is to be bonded to either side of a copper foil. A silane coupling agent is applied in the form of an aqueous solution in accordance with a dipping, spraying or the like process. Thus, a copper foil used for a printed-wiring board is completed.

In general, a covering layer according to the present invention is applied on a side of a shiny side for the purpose of serving a copper foil for a laser processing. However, there is no problem in that a covering layer is used in the form of a so-called DSTF foil (drum side treated foil) wherein a matte side of an untreated copper foil is covered with a layer, while a roughening process is applied to a shiny side thereof for bonding a resin thereto.

A further roughening step may be added on a surface of the side to which is to be subjected laser processing by means of well-known copper particles or etching a copper surface with a chemical solution, and a covering layer according to the present invention may be formed on the resulting roughened surface. The present invention is not limited to an electrolytic copper foil, but it is also applicable to a rolled copper foil, a sputtered, or deposited copper layer, and the same advantageous effects as that of the electrolytic copper foil are obtained in any copper foil or layer.

According to the copper foil of the present invention, no black oxide processing, no formation of a film and the like are required after a copper clad laminate is prepared for improving laser processability, but steps for laser processing may be instantly taken.

It is preferred that a thickness of a copper foil of the present invention is 25 μm or less, more preferable is 18 μm or less, and the most preferable is an ultrathin copper foil and a copper layer of 5 μm or less. The thinner copper layer results in the higher advantages due to influences derived from a covering layer of the invention. However, it is to be noted that the present invention is not limited to the above enumerated thicknesses.

In the following, examples of the present invention are described.

EXAMPLE 1

A shiny side of an electrolytic copper foil having 18 μm thickness wherein a matte side of an untreated copper foil had been previously roughened was subjected to cathode electroplating in a bath (A) containing:

30 g/liter of $FeSO_4.7 H_2O$, 10 g/liter of $SnSO_4$, and 40 g/liter of trisodium citrate dihydrate in pH 4.8 at the temperature of 30° C. and the current density of 1.5 A/dm$^2$ for twelve seconds, the thus electroplated copper foil is rinsed with water, and the shiny side of the copper foil was further subjected to cathode electroplating in another bath (B) containing:

5 g/liter of $Na_2Cr_2O_7.2H_2O$ in pH 4.0 at the temperature of 25° C. and the current density of 0.5 A/dm$^2$ for two seconds, the resulting copper foil was rinsed with water and then, dried.

The matte side of the copper foil to be bonded to a resin was laminated to a glass epoxy resin-impregnated base material of FR-4 grade, and the laminate was pressed under the condition of the pressure of 4 MPa and the temperature of 170° C. for sixty minutes to mold a copper clad laminate. Laser processability of a surface of the resulting copper clad laminate was examined, and the results thereof are shown in Table 1. Moreover, a covering layer on the shiny side was dissolved with an acid, an amount of elements adhered was examined in accordance with ICP analysis method, and the results thereof are shown also in Table 1.

In Table 1, laser processability was examined as follows. Five times of drilling test were repeated on each sample by means of carbon dioxide laser under such conditions that pulse energy is selected to be 15, 20, 25, and 30 mJ, respectively; a shot number is one; a pulse width is 14.5 μsec.; a frequency is 100 Hz, and a spot diameter is 160 μm, and then, an average diameter of a drilled hole was calculated. The larger average diameter of a drilled hole exhibits the better drilling property.

EXAMPLE 2

A shiny side of an electrolytic copper foil having 18 μm thickness wherein a matte side of an untreated copper foil had been previously roughened was subjected to cathode electroplating in a bath (C) containing:

30 g/liter of $FeSO_4.7H_2O$, 10 g/liter of $SnSO_4$, 5 g/liter of $NaPH_2O_2.H_2O$, and 40 g/liter of trisodium citrate dihydrate in pH 4.8 at the temperature of 30° C. in place of the bath (A) of Example 1 at the current density of 1.5 $A/dm^2$ for twelve seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

EXAMPLE 3

A shiny side of an electrolytic copper foil having 18 μm thickness wherein a matte side of the copper foil had been previously roughened was subjected to cathode electroplating in a bath (D) containing:

60 g/liter of $FeSO_4.7H_2O$, 10 g/liter of $SnSO_4$, 5 g/liter of $NaPH_2O_2.H_2O$, and 70 g/liter of trisodium citrate dihydrate in pH 4.8 at the temperature of 30° C. in place of the bath (A) of Example 1 at the current density of 1.5 $A/dm^2$ for twelve seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

EXAMPLE 4

In Example 1, a shiny side of a copper foil was subjected to cathode electroplating in a bath (E) containing:

50 g/liter of $FeSO_4.7H_2O$, 10 g/liter of $SnSO_4$, 10 g/liter of $ZnSO_4.7H_2O$, and 50 g/liter of trisodium citrate dihydrate in pH 4.3 at the temperature of 25° C. in place of the bath (A) of Example 1 at the current density of 2.0 $A/dm^2$ or ten seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

EXAMPLE 5

In Example 1, a shiny side of a copper foil was subjected to cathode electroplating in a bath (F) containing:

40 g/liter of $FeSO_4.7H_2O$, 7 g/liter of $SnSO_4$, 20 g/liter of $NiSO_4.6H_2O$, 5 g/liter of $NaPH_2O_2.H_2O$, and 50 g/liter of trisodium citrate dihydrate in pH 4.0 at the temperature of 25° C. in place of the bath (A) of Example 1 at the current density of 2.0 $A/dm^2$ for ten seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

EXAMPLE 6

In Example 1, a shiny side of a copper foil was subjected to cathode electroplating in a bath (G) containing:

30 g/liter of $FeSO_4.7H_2O$, 8 g/liter of $SnSO_4$, 10 g/liter of $CoSO_4.6H_2O$, and 50 g/liter of trisodium citrate dihydrate in pH 4.0 at the temperature of 30° C. in place of the bath (A) of Example 1 at the current density of 2.0 $A/dm^2$ for ten seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

EXAMPLE 7

In Example 1, a shiny side of a copper foil was subjected to cathode electroplating in a bath (H) containing:

20 g/liter of $FeSO_4.7H_2O$, 20 g/liter of $SnSO_4$, and 40 g/liter of trisodium citrate dihydrate in pH 4.8 at the temperature of 30° C. in place of the bath (A) of Example 1 at the current density of 1.5 $A/dm^2$ for twelve seconds. After rinsing the resulting copper foil with water, the copper foil was then dipped into 0.5 g/liter of an aqueous solution of benzotriazole, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

EXAMPLE 8

In Example 1, a shiny side of a copper foil was subjected to cathode electroplating in a bath (I) containing:

30 g/liter of $FeSO_4.7H_2O$, 8 g/liter of $SnSO_4$, 20 g/liter of $NiSO_4.6H_2O$, and 50 g/liter of trisodium citrate dihydrate in pH 4.0 at the temperature of 30° C. in place of the bath (A) of Example 1 at the current density of 2.0 $A/dm^2$ for ten seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

EXAMPLE 9

In Example 1, a shiny side of a copper foil was subjected to cathode electroplating in a bath (J) containing:

60 g/liter of $Fe_2(SO_4)_3.nH_2O$ (Fe 11 g/liter), 10 g/liter of $SnSO_4$, and 70 g/liter of trisodium citrate dihydrate in pH 4.8 at the temperature of 30° C. in place of the bath (A) of Example 1 at the current density of 1.5 $A/dm^2$ for twelve seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

COMPARATIVE EXAMPLE 1

In Example 1, a shiny side of a copper foil was subjected to cathode electroplating in a bath (K) containing:

25 g/liter of $ZnSO_4.7H_2O$, and 60 g/liter of NaOH in pH over 13 at the temperature of 30° C. in place of the bath (A) of Example 1 at the current density of 0.4 $A/dm^2$ for three seconds. After rinsing the resulting copper foil with water, the matte side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

COMPARATIVE EXAMPLE 2

A copper foil was treated under the same conditions as that of comparative Example 1 except that cathode electroplating was carried out at the current density of 1.2 $A/dm^2$ for ten seconds in the bath (K) of comparative Example 1.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

COMPARATIVE EXAMPLE 3

In Example 1, a shiny side of a copper foil was subjected to cathode electroplating in a bath (L) containing:

50 g/liter of $NiSO_4.6H_2O$ in pH 3.5 at the temperature of 30° C. in place of the bath (A) of Example 1 at the current density of 1.5 $A/dm^2$ for ten seconds. After rinsing the resulting copper foil with water, the copper foil was dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

COMPARATIVE EXAMPLE 4

In Example 1, a shiny side of a copper foil was subjected to cathode electroplating in a bath (M) containing:

30 g/liter of $FeSO_4.7H_2O$ in pH 2.0 at the temperature of 25° C. in place of the bath (A) of Example 1 at the current density of 1.5 $A/dm^2$ for twenty seconds. After rinsing the resulting copper foil with water, the copper foil was dipped into 0.2 g/liter of an aqueous solution of imidazole, and processed; thereafter the resulting copper foil was dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

COMPARATIVE EXAMPLE 5

In Example 1, a shiny side of a copper foil was subjected to cathode electroplating in a bath (N) containing:

10 g/liter of $SnSO_4$ in pH 0.7 at the temperature of 30° C. in place of the bath (A) of Example 1 at the current density of 1.0 $A/dm^2$ for seven seconds. After rinsing the resulting copper foil with water, the shiny side of the copper foil was subjected to cathode electroplating in the bath (B) of Example 1 at the current density of 0.5 $A/dm^2$ for two seconds, and the resulting copper foil was rinsed and dried.

The matte side of the copper foil to be bonded to a resin was laminated with a glass epoxy resin-impregnated base material of FR-4 grade. Laser processability and an amount of elements adhered were examined in accordance with the same manner as that of Example 1, and the results obtained are shown in Table 1.

TABLE 1

|  |  | Amount of Elements Adhered to Side Being not Bonded to Resin (mg/m²) | | | | | | | Laser Processability Diameter of Drilled Hole (μm) Laser Energy | | | |
|---|---|---|---|---|---|---|---|---|---|---|---|---|
|  |  | Fe | Sn | Co | Zn | Ni | P | Cr | 15 mJ | 20 mJ | 25 mJ | 30 mJ |
| Example | 1 | 98 | 121 | 0 | 0 | 0 | 0 | 6 | 69 | 81 | 95 | 105 |
|  | 2 | 146 | 128 | 0 | 0 | 0 | 7 | 8 | 68 | 82 | 96 | 102 |
|  | 3 | 314 | 78 | 0 | 0 | 0 | 15 | 9 | 76 | 84 | 93 | 106 |
|  | 4 | 217 | 93 | 0 | 119 | 0 | 0 | 9 | 77 | 84 | 96 | 105 |
|  | 5 | 271 | 42 | 0 | 0 | 24 | 31 | 6 | 69 | 81 | 91 | 102 |
|  | 6 | 206 | 94 | 31 | 0 | 0 | 0 | 8 | 76 | 83 | 97 | 105 |
|  | 7 | 21 | 220 | 0 | 0 | 0 | 0 | 0 | 68 | 80 | 97 | 102 |
|  | 8 | 263 | 90 | 0 | 0 | 21 | 0 | 5 | 76 | 85 | 95 | 108 |
|  | 9 | 36 | 59 | 0 | 0 | 0 | 0 | 7 | 51 | 79 | 91 | 100 |
| Comparative Example | 1 | 0 | 0 | 0 | 24 | 0 | 0 | 6 | 0 | 0 | 0 | 0 |
|  | 2 | 0 | 0 | 0 | 369 | 0 | 0 | 6 | 0 | 22 | 65 | 82 |
|  | 3 | 0 | 0 | 0 | 0 | 363 | 0 | 0 | 0 | 0 | 60 | 82 |
|  | 4 | 297 | 0 | 0 | 0 | 0 | 0 | 0 | 0 | 36 | 75 | 94 |
|  | 5 | 0 | 102 | 0 | 0 | 0 | 0 | 6 | 0 | 70 | 76 | 95 |

Throughout the examples and the comparative examples, each thickness of all the copper foils is 18 μm as mentioned above.

Concerning laser processability, it is understood from Table 1 that a diameter of each drilled hole is larger in the examples of a copper foil according to the present invention than that of the comparative examples, and that a hole can be drilled with lower energy in the examples than that of the comparative examples. Accordingly, it is apparent that direct laser processability is highly effective in a copper foil of the present invention.

According to the present invention, the following advantages are obtained.

(1) It becomes possible to apply copper direct drilling process by carbon dioxide laser onto a copper foil surface of a copper clad laminate, besides; better processability is achieved in the present invention in comparison with a conventional copper foil. Furthermore, a complicated operation such as black oxide processing is not required, whereby a copper foil which is the most suitable for manufacturing a high-density printed-wiring board can be provided.

(2) Since it is sufficient for forming a thinner layer than that in case of a conventional copper foil, a processing period of time can be reduced. In that context, the present invention is highly efficient in a manufacture of a copper foil. Moreover, since many unnecessary metal layers are not used, an environmental load is small on a user side.

(3) The surface-treating method according to the present invention is easily introduced into a practical manufacturing case, so that a mass production thereof can be realized.

What is claimed is:

1. A copper foil used for a direct drilling process by laser, in which a covering layer consisting of iron and tin is provided on at least one side of the copper foil as a layer for improving laser processability, and a thickness of said covering layer is within the range of 50 to 1000 mg/m².

2. A copper foil used for a direct drilling process by laser, in which a covering layer made of an alloy prepared from iron, tin, and at least one member selected from the group consisting of nickel, cobalt, zinc, chromium, and phosphorous is provided on at least one side of the copper foil as a layer for improving laser processability, and a thickness of said covering layer is within the range of 50 to 1000 mg/m².

3. A copper foil used for a direct drilling process by laser, in which a covering layer consisting essentially of iron and tin is provided on at least one side of the copper foil as a layer for improving laser processability, and a thickness of said covering layer is within the range of 50 to 1000 mg/m².

* * * * *